(12) United States Patent
Ahn

(10) Patent No.: US 7,133,100 B2
(45) Date of Patent: Nov. 7, 2006

(54) METHOD FOR TREATING SURFACE OF ORGANIC INSULATING FILM USING HELIUM PLASMA AND METHOD OF FABRICATING THIN FILM TRANSISTOR SUBSTRATE USING THE SAME

(75) Inventor: Byung Yong Ahn, Taegu-shi (KR)

(73) Assignee: LG.Philips LCD Co., Ltd., Seoul (KR)

( * ) Notice: Subject to any disclaimer, the term of this patent is extended or adjusted under 35 U.S.C. 154(b) by 0 days.

(21) Appl. No.: 10/114,123

(22) Filed: Apr. 3, 2002

(65) Prior Publication Data

US 2002/0192851 A1 Dec. 19, 2002

(30) Foreign Application Priority Data

Jun. 1, 2001 (KR) .................... 10-2001-0030891

(51) Int. Cl.
*G02F 1/1333* (2006.01)
*G02F 1/1343* (2006.01)
*H01L 21/00* (2006.01)

(52) U.S. Cl. .................. 349/138; 349/139; 349/143; 438/30

(58) Field of Classification Search ........... 349/138, 349/139, 158, 143; 438/30
See application file for complete search history.

(56) References Cited

U.S. PATENT DOCUMENTS

| | | | | | |
|---|---|---|---|---|---|
| 5,805,252 | A | * | 9/1998 | Shimada et al. ........... 349/113 |
| 5,891,527 | A | * | 4/1999 | Turek et al. ............... 427/448 |
| 6,038,008 | A | * | 3/2000 | Kim et al. ................. 349/138 |
| 6,118,218 | A | * | 9/2000 | Yializis et al. ............. 315/111 |
| 6,124,517 | A | * | 9/2000 | Kaminsky et al. ......... 585/829 |
| 6,218,206 | B1 | * | 4/2001 | Inoue et al. ................ 438/30 |
| 6,441,553 | B1 | * | 8/2002 | Yializis et al. .......... 315/111.21 |
| 6,678,035 | B1 | * | 1/2004 | Lee et al. .................. 349/187 |
| 2002/0195950 | A1 | * | 12/2002 | Mikhael et al. ........ 315/111.21 |
| 2003/0059550 | A1 | * | 3/2003 | Nishikawa et al. ......... 427/460 |
| 2003/0155332 | A1 | * | 8/2003 | Datta et al. ............ 219/121.51 |

FOREIGN PATENT DOCUMENTS

JP 11-283934 10/1999

* cited by examiner

*Primary Examiner*—Andrew Schechter
*Assistant Examiner*—Mike Qi
(74) *Attorney, Agent, or Firm*—McKenna Long & Aldridge LLP

(57) ABSTRACT

A fabricating method of a thin film transistor substrate according to the present invention includes the steps of forming on a substrate material a thin film transistor array including a plurality of signal lines; forming an organic insulating film on the substrate material on which the thin film transistor array has formed; patterning the organic insulating film; performing a surface treatment on a surface of the organic insulating film using helium plasma; and forming a transparent electrode layer on the organic insulating film.

7 Claims, 9 Drawing Sheets

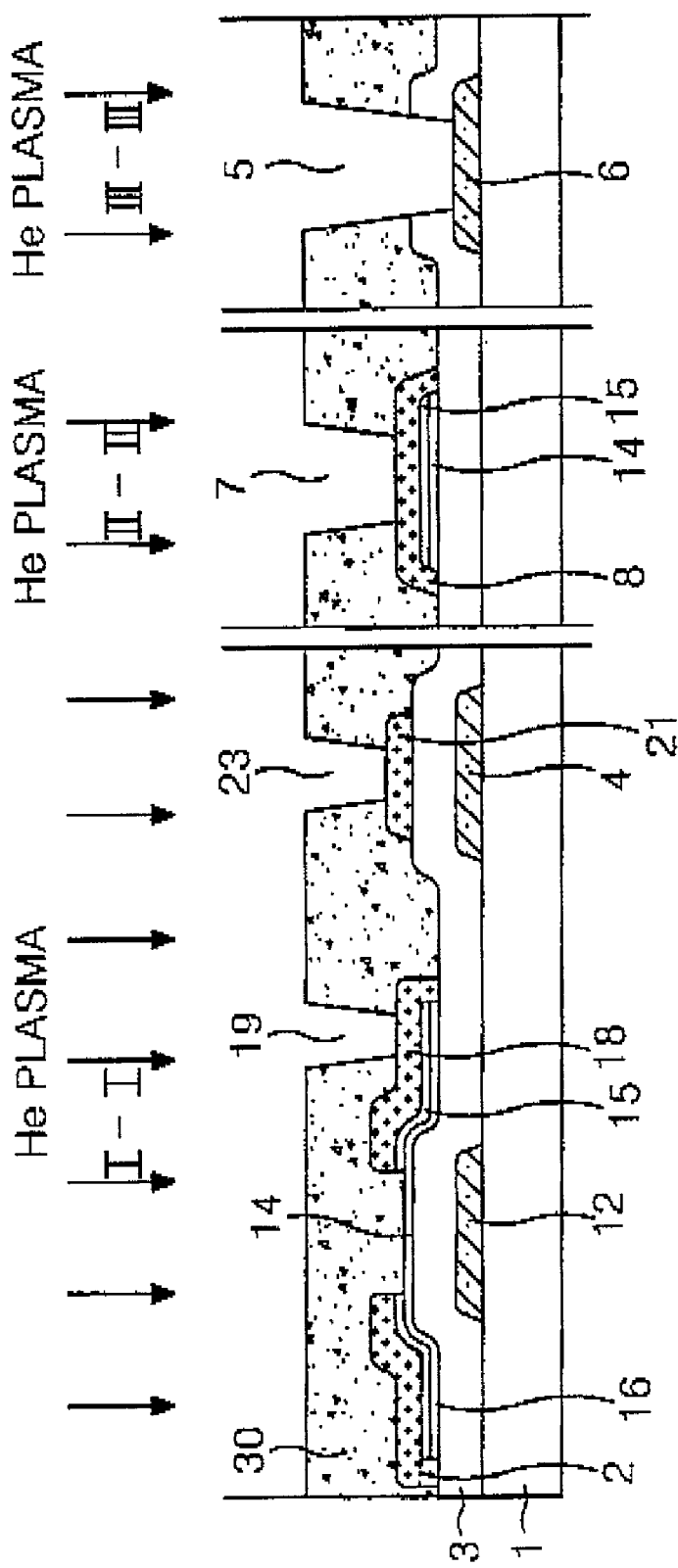

METHOD FOR TREATING SURFACE OF ORGANIC INSULATING FILM USING HELIUM PLASMA AND METHOD OF FABRICATING THIN FILM TRANSISTOR SUBSTRATE USING THE SAME

The present invention claims the benefit of Korean Patent Application No. P2001-30891 filed in Republic of Korea on Jun. 1, 2001, which is hereby incorporated by reference.

BACKGROUND OF THE INVENTION

1. Field of the Invention

The present invention relates to a method of treating the surface of an organic insulating film and a method of fabricating a thin film transistor using the same, and more particularly, to a method for treating the surface of an organic insulating film for improving the adhesive strength between the organic insulating film and a transparent electrode and a method of fabricating a thin film transistor substrate using the same.

2. Discussion of the Related Art

A liquid crystal display device controls the light transmissivity of liquid crystal using an electric field to display a picture. To this end, the liquid crystal display device includes a liquid crystal display panel having liquid crystal cells arranged in a matrix configuration and a driving circuit for driving the liquid crystal display panel.

In the liquid crystal display panel, gate lines and data lines are arranged respectively crossing each other. The liquid crystal cells are positioned at each area where the gate lines cross the data lines. The liquid crystal display panel is provided with a common electrode and pixel electrodes for applying an electric field to each of liquid crystal cells. Each pixel electrode is connected to one of the data lines via a thin film transistor (hereafter TFT) as a switching device.

The gate terminal of the thin film transistor is connected to a respective one of the gate lines allowing a pixel voltage signal to be applied to the pixel electrodes for one line. The driving circuit includes a gate driver for driving the gate lines, a data driver for driving the data lines, and a common voltage generator for driving the common electrode. The gate driver sequentially applies a scanning signal. Namely, a gate signal is applied sequentially to the gate lines to drive the liquid crystal cells on the liquid crystal display panel one line by one line. The data driver applies a data voltage signal to each of the data lines whenever the gate signal is applied to any one of the gate lines. The common voltage generator applies a common voltage signal to the common electrode.

Accordingly, the LCD controls the light transmissivity by changing the arrangement state of the liquid crystal between the pixel electrode and the common electrode in accordance with the pixel voltage signal for each liquid crystal cell, thereby displaying a picture.

FIG. 1 is an electrode arrangement plan of a thin film transistor substrate included in a general liquid crystal display device. As shown, the liquid crystal display device includes a thin firm transistor (TFT) substrate having a data line 2 and a gate line 4 arranged respectively crossing each other.

A TFT 10 is provided at the intersection of the data line 2 and the gate line 4. A pixel electrode 20, which is connected to a drain electrode 18 of the TFT 10 through a first contact hole 19, is provided in a cell area. The pixel electrode 20 is connected to the data line 2 via the drain electrode 18, an active layer 14 and a source electrode 16 of the TFT 10. A gate electrode 12 of the TFT 10 is connected to the gate line 4. The TFT 10 corresponds to a gate signal supplied to the gate line 4 to have a pixel voltage, which is applied to the data line 2, charged the pixel electrode 20 with and sustained.

A potential difference is generated between the pixel electrode 20 and a common electrode (not shown) formed on a upper substrate (not shown) because of the charged pixel voltage. By this potential difference, the liquid crystal positioned between the TFT substrate and the upper substrate, rotates as a result of a dielectric anisotropy, thereby transmitting to the upper substrate a light incident via the pixel electrode 20 from a light source (not shown).

The pixel electrode 20 is formed to overlap with the previous gate line 4 so that a storage capacitor 24 is formed for steadying the pixel voltage charged or the pixel electrode 20. To increase the capacitance of the storage capacitor 24, an overlapping storage electrode 21 is further included and has the gate line 4 and a gate insulating layer in between them.

The storage electrode 21 is connected to the pixel electrode 20 through a second contact hole 23 penetrating a protective film (not shown). The data line 2 is connected to a data driver (not shown) through a data pad portion 13, and the gate line 4 is connected to a gate driver (not shown) through a gate pad portion 11. The gate pad portion 11 includes a gate pad electrode 6 extended from the gate line 4 and a protective electrode 22 connected to the gate pad electrode 6 through a third contact hole 5 penetrating a gate insulating film (not shown) and a protective film (not shown). The data pad portion 13 includes a data pad electrode 8 extended from the data line 2 and a protective electrode 22 connected to the data pad electrode 8 through a fourth contact hole 7 penetrating the protective film.

To describe in detail the fabricating method of the TFT substrate with such a structure, it is illustrated in FIGS. 2A to 2C.

FIG. 2A provides a cross-sectional view illustrating a first step of a conventional fabricating method of the thin film transistor substrate shown in FIG. 1. As shown in this drawing, there are formed gate patterns, source/drain patterns and a thin film transistor TFT 10 on a lower substrate 1. Firstly, a gate metal layer is entirely deposited on the lower substrate 1 by a deposition method such as sputtering technique or the like. Chromium (Cr), molybdenum (Mo), metal of aluminum system or the like may be used as the gate metal layer having a single layer structure or a double layer structure. The gate metal layer is patterned on the lower substrate 1 by a photolithography process using a first mask and an etching process to form gate patterns including the gate line 4, the gate electrode 12 and the gate pad electrode 6.

A gate insulating film 3 is entirely formed on the lower substrate 1, where the gate patterns have been formed by a deposition method such as plasma enhanced chemical vapor deposition (PECVD) or the like. The material for the gate insulating film 3 may be an insulating material such as silicon oxide (SiOx), silicon nitride (SiNx) or the like.

A semiconductor layer and a semiconductor layer doped with impurities are continuously deposited on the gate insulating film 3 by a deposition method such as a PECVD technique or the like. Amorphous silicon or polycrystalline silicon may be used for the semiconductor layer. Subsequently, the semiconductor layer and the semiconductor layer doped with impurities are patterned by the photolithography using a second mask and the etching process to form an active layer 14 and an ohmic contact layer 15.

A source/drain metal is entirely deposited by the deposition process such as the sputtering technique on the gate insulating film 3 where the active layer 14 and the ohmic contact layer 15 have been formed. Molybdenum (Mo), titanium, tantalum, molybdenum alloy or the like may be used for the source/drain metal. Subsequently, the source/drain metal is patterned by the photolithography process using a third mask and the etching process to form source/drain patterns such as the data line 2, the source electrode 16, the drain electrode 18, the storage electrode 21, and the data pad electrode 8. Then, the source electrode 16 and the drain electrode 18 are dry-etched using a mask to eliminate the ohmic contact layer 15 between the source electrode 16 and the drain electrode 18.

FIG. 2B is a sectional view illustrating a second step of a conventional fabricating method of the thin film transistor substrate shown in FIG. 1. As shown, an organic insulating film 26 is entirely formed by the process such as spin-coating and the like on the gate insulating film 3 where the source/drain patterns have been formed. For the material of the organic insulating film 26, an organic compound of acrylic system, benzocyclobutene (BCB), perfluorocyclobutane (PFCB) and the like which have small dielectric constant, may be used. The organic insulating film 26 is patterned by the photolithography process using a fourth mask and the etching process to form first through fourth contact holes 19, 23, 7 and 5. Each of the first through fourth contact holes 19, 23, 7 and 5 respectively exposes the drain electrode 18, the storage electrode 21, the data pad electrode 8 and the gate pad electrode 6. Herein, the third contact hole 5, formed at the gate pad portion 11, is formed penetrating through the gate insulating film 3.

FIG. 2C is a sectional view illustrating a third step of a conventional fabricating method of the thin film transistor substrate shown in FIG. 1. As shown, transparent electrode patterns including the pixel electrode 20 and the protective electrode 22 are formed on the organic insulating film 26. A transparent electrode material is entirely deposited on the organic insulating film 26 by a deposition method such as sputtering technique or the like. For the transparent electrode material, indium-tin-oxide (ITO), indium-zinc-oxide (IZO) or indium-tin-zinc-oxide (ITZO), may be used. The transparent electrode material is patterned by the photolithography process using a fifth mask and the etching process to form the pixel electrode 20 and the protective electrode 22 of the pad portions 11 and 13.

The pixel electrode 20 electrically contacts the drain electrode 18 through the first contact hole 19 and the storage electrode 21 through the second contact hole 23. The protective electrode 22 electrically contacts the gate pad electrode 6 and the data pad electrode 8 through the third and the fourth contact holes 5 and 7, respectively. The edge area of the pixel electrode 20 is capable of being formed to overlap with the data line 2 because the organic insulating material having small dielectric constants is adopted for the protective film 26. As a result, the area of the pixel electrode 20 is increased to improve the aperture ratio.

In this way, the aperture ratio can be improved by adopting the organic insulating material for the protective film 26 in the conventional thin film transistor substrate. However, the organic insulating film 26 has a disadvantage of an insufficient adhesive strength to the transparent electrode material because the organic insulating film 26 is formed by the spin-coating technique to achieve a surface smooth. Consequently, problems may occur. For example, etchant may penetrate between the organic insulating film 26 and the transparent electrode layer where the adhesion of the organic insulating film is insufficient during a wet patterning process after deposition of the transparent electrode material on the organic insulating film 26. As a result, critical defects such as a broken wire of the pixel electrode or the like, may occur.

SUMMARY OF THE INVENTION

Accordingly, the present invention is directed to a method for treating surface of an organic insulating film and method of fabricating a thin film transistor substrate using the same that substantially obviate one or more of the problem due to limitations and disadvantages of the related art.

An object of the present invention is to provide a method of treating the surface of an organic insulating film for improving the adhesive strength of the organic insulating film to a transparent electrode.

Another object of the present invention is to provide a method of fabricating a liquid crystal display using the organic insulating film with improved yield.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawing.

To achieve these and other advantages and in accordance with the purpose of the present inventions, as embodied and broadly described, the method of treating the surface of an organic insulating film on which a deposition layer is to be deposited, has a characteristic of using helium plasma to treat the surface of the organic insulating film.

In another aspect, the method of fabricating a thin film transistor substrate includes the steps of forming on a substrate material a thin film transistor array and a plurality of signal lines; forming an organic insulating film on the substrate material on which the thin film transistor array has formed; patterning the organic insulating film; performing a surface treatment on the organic insulating film using helium plasma; and forming a transparent electrode layer on the organic insulating film.

In another aspect, the method of fabricating a thin film transistor substrate includes the steps of forming on a substrate material a thin film transistor array and a plurality of signal lines; forming an organic insulating film on the substrate material on which the thin film transistor array has formed; patterning the organic insulating film; performing a surface treatment the organic insulating film using a chemically stable inert gas having a small atomic size; and forming a transparent electrode layer on the organic insulating film.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings:

FIGS. 3A to 3C are sectional views illustrating steps of a fabricating method of the thin film transistor substrate including a surface treatment method of an organic insulating film according to an embodiment of the present invention;

DETAILED DESCRIPTION OF THE PREFERRED EMBODIMENTS

Reference will now be made in detail to the preferred embodiments of the present invention, examples of which are illustrated in the accompanying drawings. Whenever possible, the same reference numbers will be used throughout the drawings to refer the same or like parts.

Figure 1:
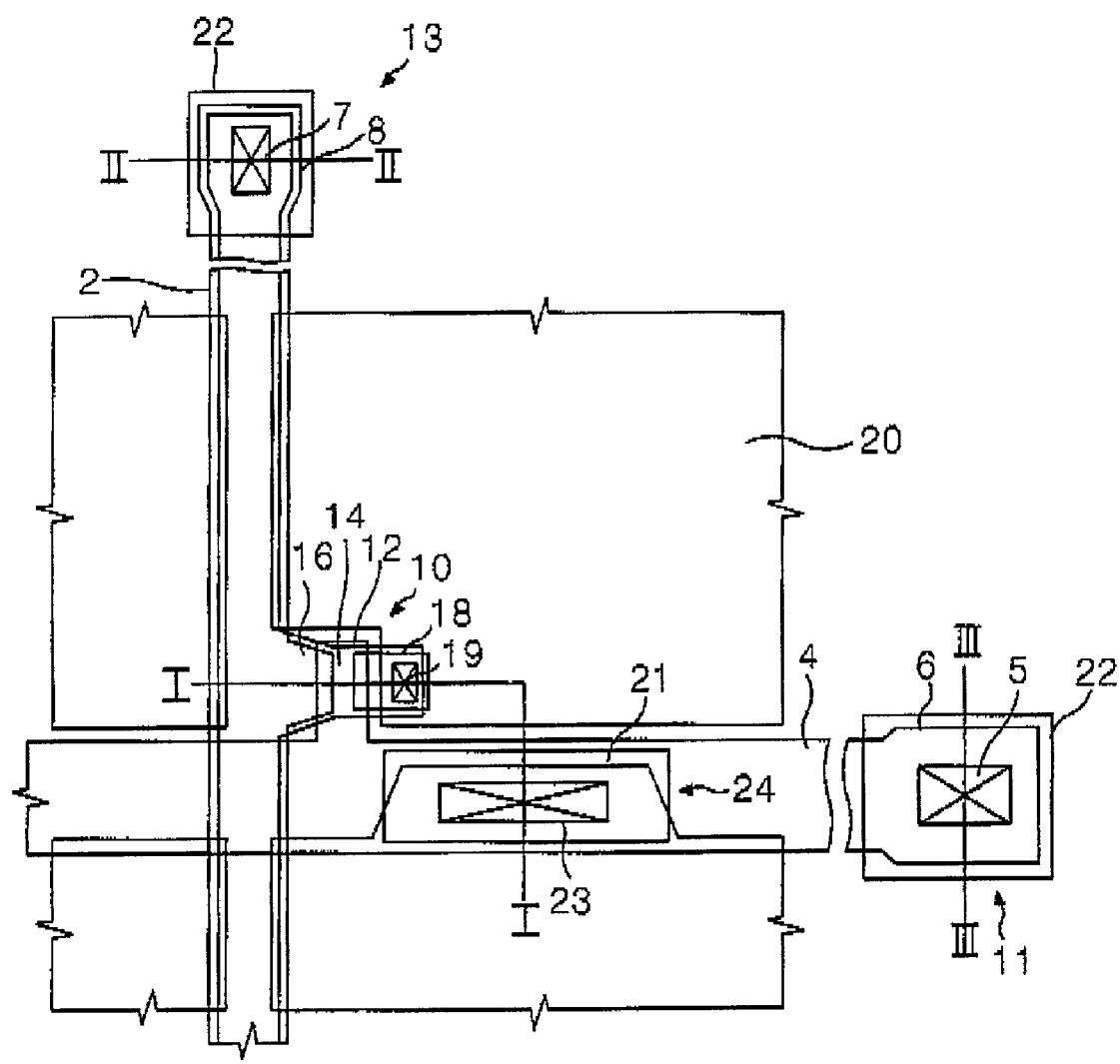
FIG. 1 is an electrode arrangement plan of a thin film transistor substrate included in a general liquid crystal display device used for describing both the conventional art and the present invention.
Figure 2A:
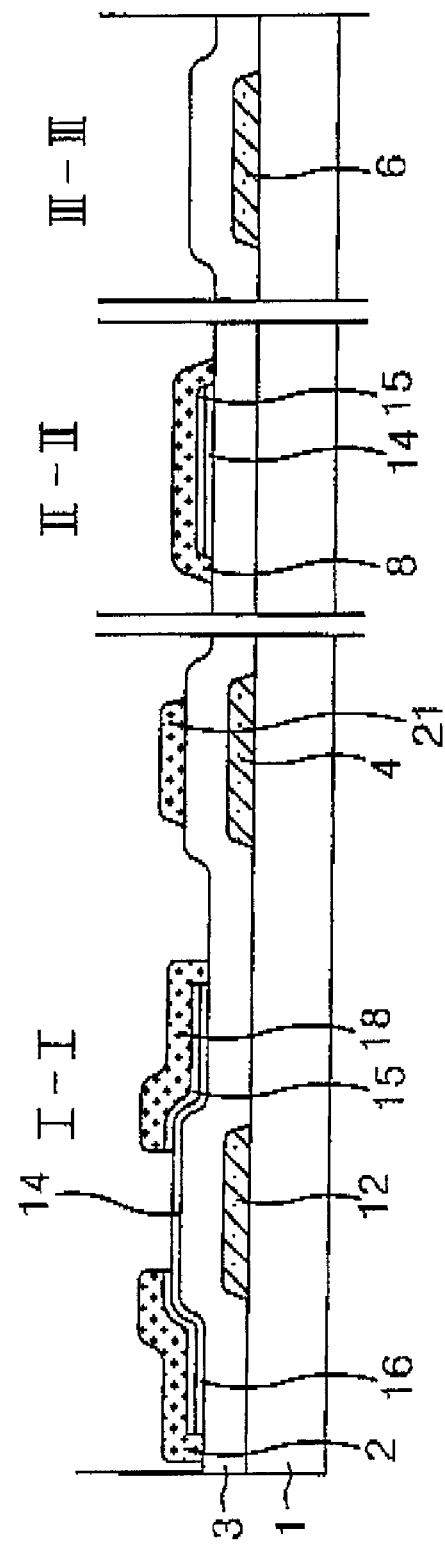
FIGS. 2A to 2C are sectional views illustrating steps of a conventional fabricating method of the thin film transistor substrate shown in FIG. 1.
Figure 2B:
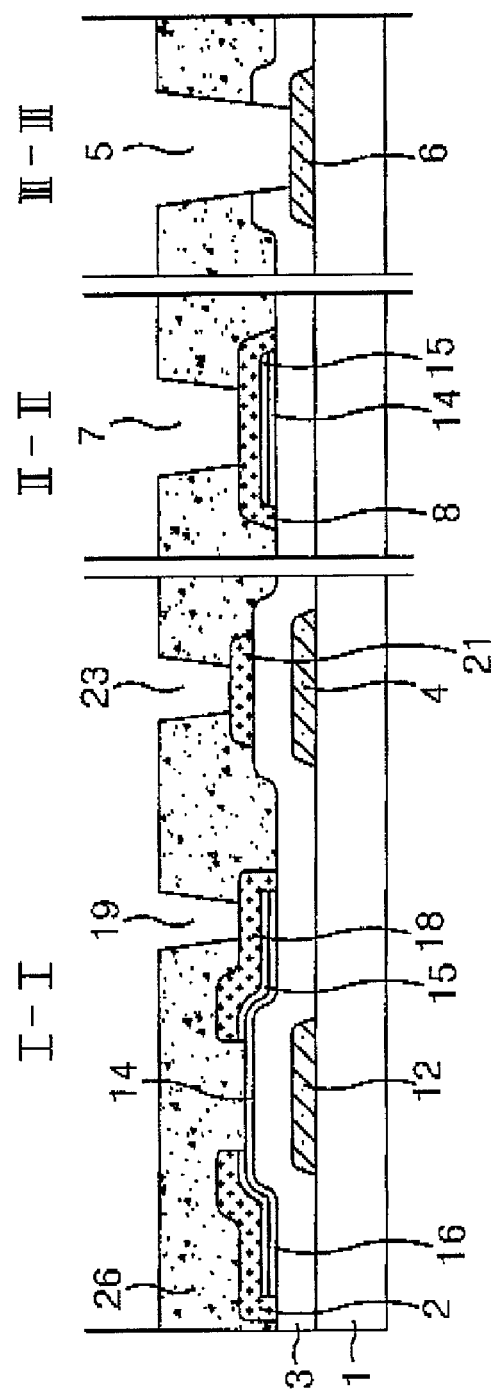
Figure 2C:
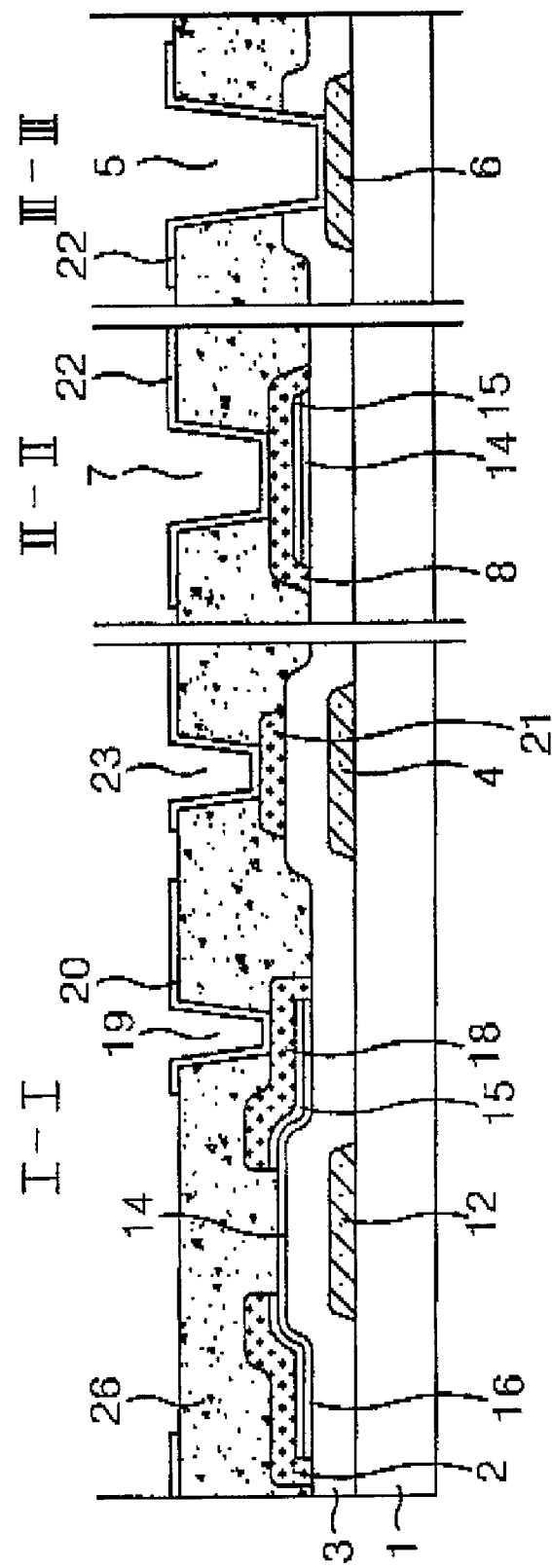
Figure 3A:
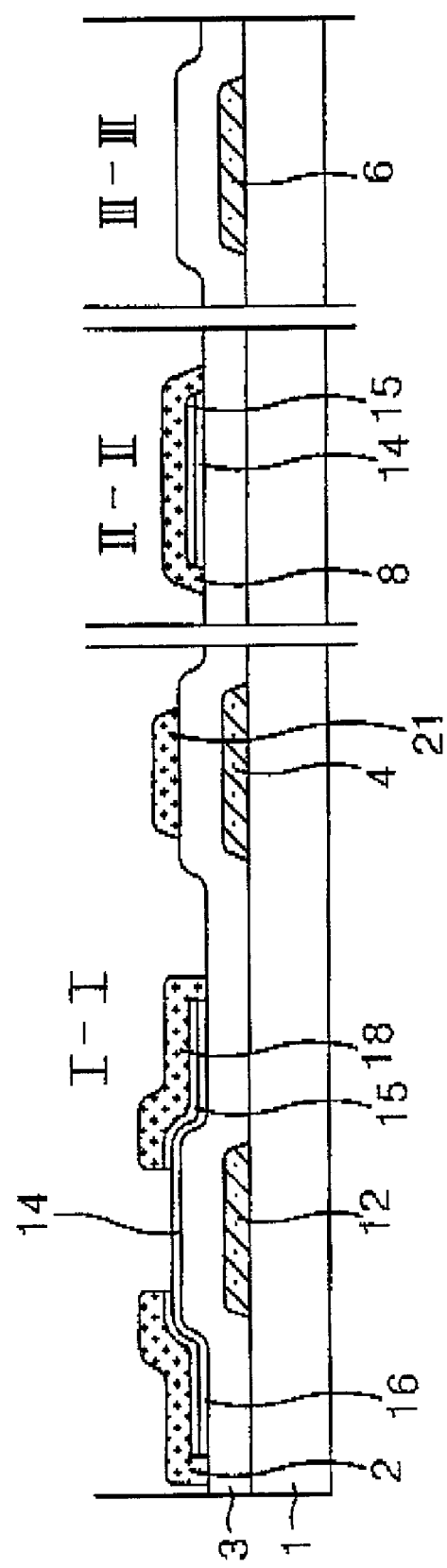
Figure 3C:
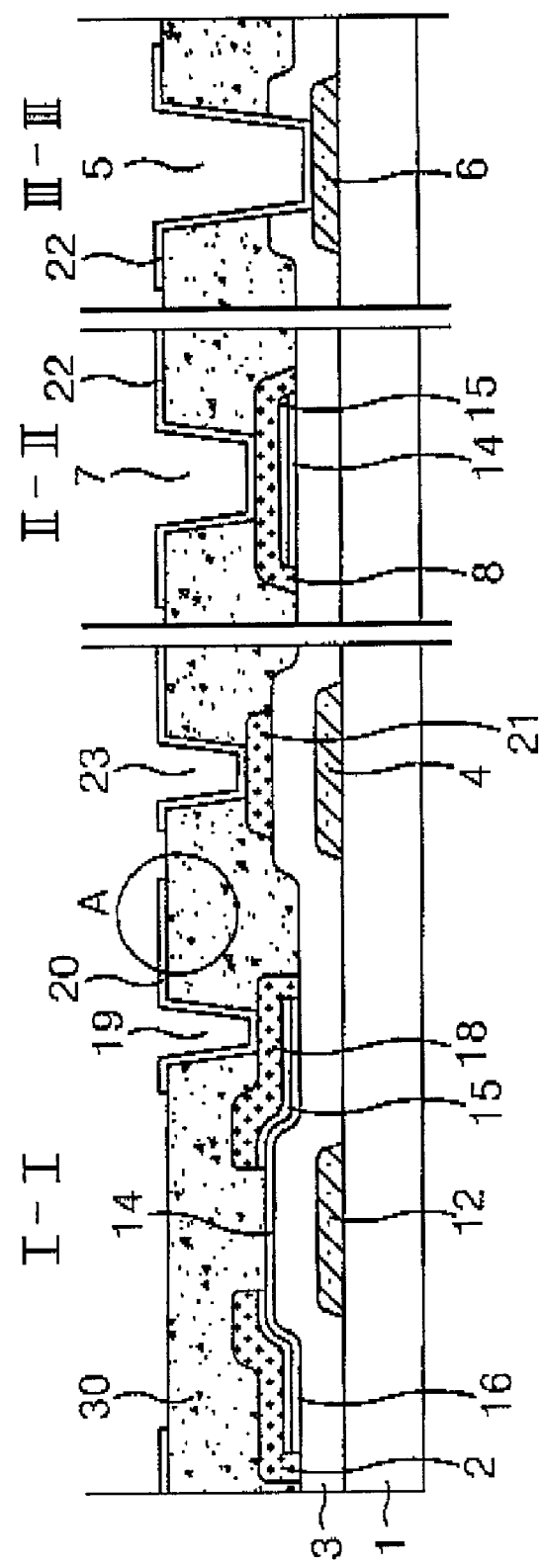

FIGS. 3A to 3C are sectional views sequentially illustrating a fabricating method of a thin film transistor substrate including the surface treatment method of an organic insulating film according to the preferred embodiment of the present invention.

FIG. 3A illustrates a first step of the fabricating method of the thin film transistor substrate. As shown, there are formed gate patterns, source/drain patterns and a thin film transistor TFT 10 on a lower substrate 1. First, a gate metal layer is entirely deposited on the lower substrate 1 by a deposition method such as a sputtering technique or the like. Chromium (Cr), molybdenum (Mo), metal of aluminum system or the like may be used as the gate metal layer having a single layer structure or a double layer structure. The gate metal layer is patterned on the lower substrate 1 by a photolithography process using a first mask and an etching process to form gate patterns including the gate line 4, the gate electrode 12 and the gate pad electrode 6.

A gate insulating film 3 is formed on the entire lower substrate 1, where the gate patterns have been formed by a deposition method such as plasma enhanced chemical vapor deposition (PECVD) or the like. The material for the gate insulating film 3 may be an insulating material such as silicon oxide (SiOx), silicon nitride (SiNx) or the like.

A semiconductor layer and a semiconductor layer doped with impurities are continuously deposited on the gate insulating film 3 by a deposition method such as a PECVD technique or the like. Amorphous silicon or polycrystalline silicon may be used for the semiconductor layer. Subsequently, the semiconductor layer and the semiconductor layer doped with impurities are patterned by the photolithography using a second mask and the etching process to form an active layer 14 and an ohmic contact layer 15.

A source/drain metal is entirely deposited by a deposition process such as a sputtering technique on the gate insulating film 3 where the active layer 14 ad the ohmic contact layer 15 have been formed. Molybdenum (Mo), titanium, tantalum, molybdenum alloy or the like may be used for the source/drain metal. Subsequently, the source/drain metal is patterned by the photolithography process using a third mask and the etching process to form source/drain patterns such as the data line 2, the source electrode 16, the drain electrode 18, the storage electrode 21, and the data pad electrode 8. Then, the source electrode 16 and the drain electrode 18 are dry-etched using a mask to eliminate the ohmic contact layer 15 between the source electrode 16 and the drain electrode 18.

FIG. 3B illustrates a second step of the fabricating method of the thin film transistor substrate. As shown in FIG. 3B, an organic insulating film 30 is formed by a process such as spin-coating or the like on the entire gate insulating film where the source/drain patterns have been formed, For the material of the organic insulating film 30, an organic compound of acrylic system, benzocyclobutene (BCB), perfluorocyclobutane (PFCB) or the like having a small dielectric constant may be used. The organic insulating film 30 is patterned by the photolithography process using a fourth mask and the etching process to form first through fourth contact holes 19, 23, 7 and 5. Each of the first to fourth contact holes 19, 23, 7 and 5 respectively exposes the drain electrode 18, the storage electrode 21, the data pad electrode 8, and the gate pad electrode 6.

Herein, the third contact hole 5, formed at the gate pad portion 11, is formed penetrating through the gate insulating film 3. Subsequently, a physical impact is given to the surface of the organic insulating film 30 using a helium (He) plasma to roughen the surface of the organic insulating film 30. Particularly, the physical impact onto the surface of the organic insulating film 30 is performed using helium plasma produced by ionizing helium gas (which is a chemically stable inert gas and is small in atomic size) so that the coarseness of the surface of the organic insulating film 30 is small and evenly distributed.

FIG. 3C illustrates a third step of the fabricating method of the thin film transistor substrate. As shown in this drawing, transparent electrode patterns, including the pixel electrode 20 and the protective electrode 22, are formed on the organic insulating film 30. A transparent electrode material is deposited on the entire organic insulating film 30 by a deposition method such as the sputtering technique or the like. At this time, the transparent electrode layer has a surface treatment with the helium plasma to increase the contact surface of the organic insulating film 30. Thereby, the transparent electrode layer is provided with sufficient adhesive strength to the organic insulating film 30. For the transparent electrode material, indium-tin-oxide (ITO), indium-zinc-oxide (IZO) or indium-tin-zinc-oxide (ITZO), may be used. The transparent electrode material is patterned by the photolithography process using a fifth mask and the etching process to form transparent electrode patterns including the pixel electrode 20 and the protective electrode 22.

Figure 4:
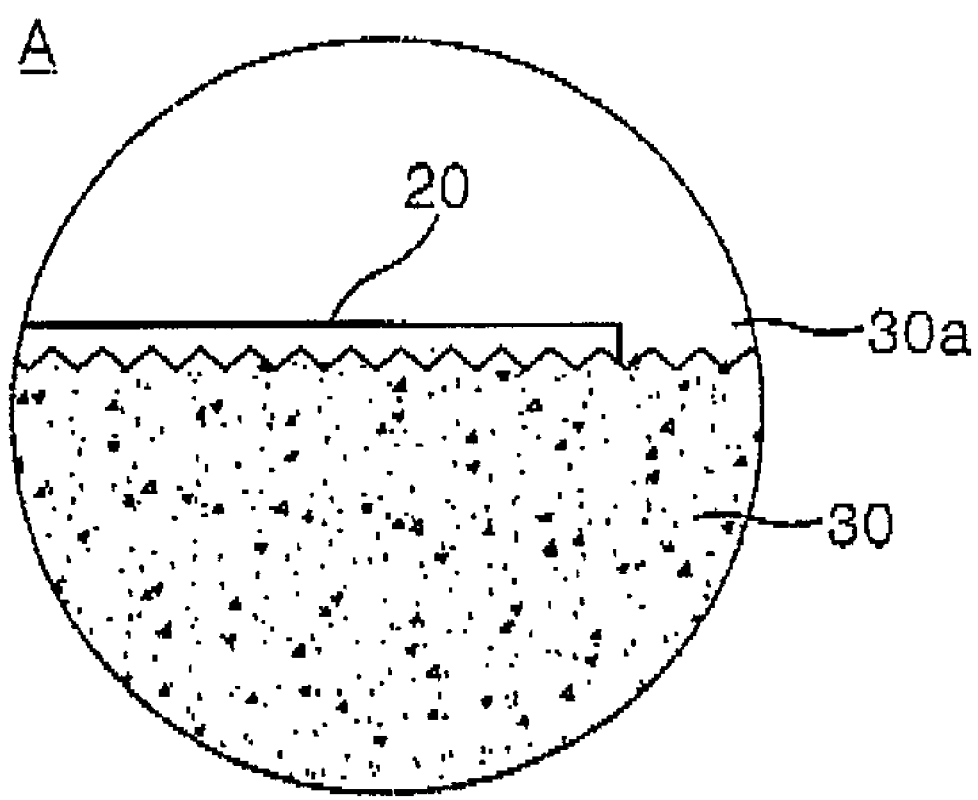
FIG. 4 is a magnified view showing the interface portion (A) of a pixel electrode and the organic insulating film shown in FIG. 3C.

At this time, since the transparent electrode patterns 20 and 22 have a sufficient adhesive strength to the organic insulating film 30 having a rough surface, such as the pixel electrode 20 shown in FIG. 4, they can be formed normally while preventing the loss of transparent electrode patterns 20 and 22 by the etchant. The pixel electrode 20 electrically contacts the drain electrode 18 through the first contact hole 19 and contacts the storage electrode 21 through the second contact hole 23. The protective electrode 22 electrically contacts the gate pad electrode 6 and the data pad electrode 8 through the third contact hole 5 and the fourth contact hole 7, respectively The edge area of the pixel electrode 20 overlaps with the data line 2 so that the area of the pixel electrode 20 is increased, thereby improving the aperture ratio.

In this way, in the fabricating method of the TFT substrate according to the preferred embodiment of the present invention, the organic insulating film is treated to have a coarse surface by the helium plasma. Thereby, the surface of the organic insulating film contacting the transparent electrode is increased, and as a result, the adhesive strength of the organic insulating film is substantially improved. Particularly, by using the helium plasma which has small atomic size and mass among the inert gases, the coarseness of the surface of the organic insulating film is distributed even and small to strengthen the adhesive strength of the organic insulating film to the transparent electrode.

In other words, when the helium plasma is used, the adhesive strength of the organic insulating film to the transparent electrode is much greater than when there is used an inert gas plasma, such as argon (Ar), Neon (Ne) or the like, which has a big atomic size and mass relatively. The results can be confirmed by the experiment data shown in Table 1 and by the graph illustrating the relationship between the transparent electrode pattern loss amount and the surface treatment shown in FIG. 5.

Table 1 represents the resultant data of the experiment of measuring the transparent electrode pattern loss amount according to the surface treatment of the organic insulating film when the organic insulating film is made of a photo acrylic acid resin.

TABLE 1

| Surface treatment of photo acrylic | P(μm) | CD LOSS (μm) | Judging if product is good or defective |
|---|---|---|---|
| No surface treatment | 32.349 | 20.030 | Defective |
| Oxygen (O₂) plasma | 26.538 | 14.477 | Defective |
| Helium (He) plasma | 15.304 | 0.923 | Good |

Figure 5:
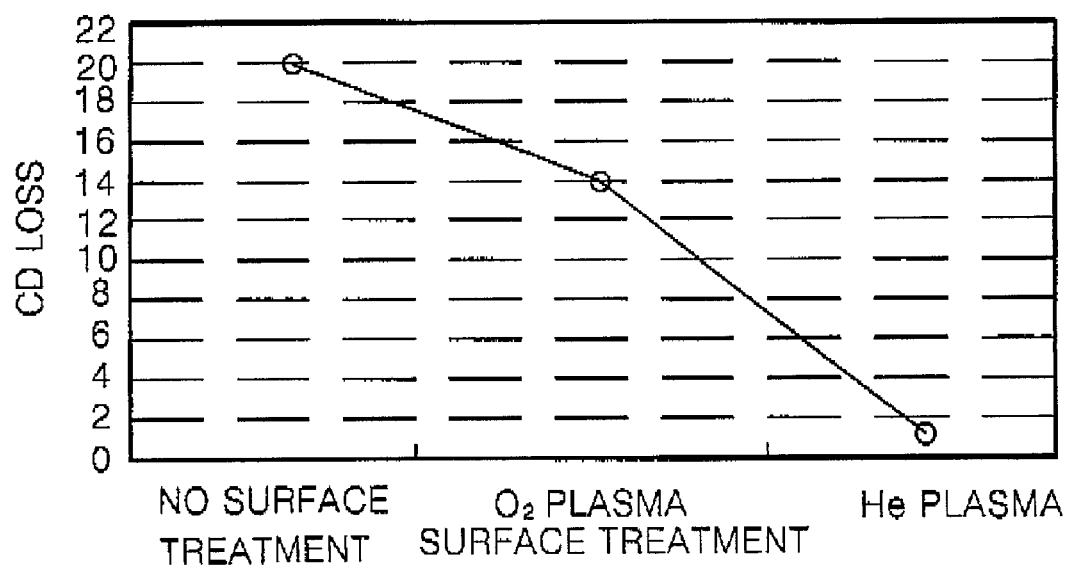
FIG. 5 is a graph representing the relationship between the surface treatment of an organic insulating film and a transparent electrode pattern loss amount.

As shown in Table 1, P represents the width between pixel electrodes overlapping one another at the data line portion, CD LOSS represents a transparent electrode pattern loss amount after wet-etching. FIG. 5 is a graph representing the relationship between the surface treatment of the organic insulating film and a transparent electrode pattern loss amount This graph depicts the transparent electrode pattern loss amount (CD LOSS) according to the surface treatment of the photo acrylic protective film shown in Table 1. As shown in Table 1 and FIG. 5, while the transparent electrode pattern loss amount. (CD LOSS) is around 20 μm to judge that the transparent electrode pattern is defective when no surface treatment is performed on the photo acrylic protective film, the transparent electrode pattern loss amount (CD LOSS) is diminished less than or equal to 1 μm remarkably to judge that the transparent electrode pattern is good when the surface treatment is performed by using the helium plasma.

Particularly, when the surface treatment is performed using the helium (He) plasma, the transparent electrode pattern loss amount (CD LOSS) is remarkably smaller than when the surface treatment is performed by using oxygen (O₂) plasma of which the atomic size is bigger than helium (He) and smaller than argon (Ar). When the surface treatment is performed by using the argon (Ar) plasma as another inert gas, the transparent electrode pattern loss amount (CD LOSS) is predicted much bigger than when the surface treatment is performed using oxygen (O₂) plasma because the atomic size and mass of argon is bigger than oxygen, and as a result, the coarseness of the surface becomes big and uneven.

Therefore, it is most desirable to use helium gas which has the smallest atomic size and mass among the inert gases to treat the surface of the organic insulating film, thereby obtaining a sufficient adhesive strength to the transparent electrode.

As described above, in the fabricating method of the TFT substrates according to the present invention, the surface treatment is performed on the organic insulating film by using the helium plasma to increase the contact surface, thereby remarkably improving the adhesive strength to the transparent electrode. Accordingly, in the method, the transparent electrode pattern is formed in a desirable state by minimizing the transparent electrode pattern loss during the wet-etching for the patterning of the transparent electrode. Thereby, the broken wire and defects due to the loss of the transparent electrode pattern, can be prevented, which result in the improvement of the yield of production.

It will be apparent to those skilled in the art that various modifications and variations can be made in the method for treating surface of organic insulating film and method of fabricating thin film transistor substrate using the same of the present invention without departing from the spirit or scope of the invention. Thus, it is intended that the present invention cover the modifications and variations of this invention provided they come within the scope of the appended claims and their equivalents.

What is claimed is:

1. A method of manufacturing a liquid crystal display device having a thin film transistor, comprising the steps of:
providing an organic insulating film on a substrate of the liquid crystal display device;
treating a surface of the organic insulating film using plasma consisting essentially of helium to roughen the entire surface of the organic insulating film;
depositing a layer on the roughened surface of the organic insulating film,
wherein the roughened surface of the organic insulating film has a coarseness that is small and substantially evenly distributed over the entire surface for improving adhesion between the layer and the organic insulating film.

2. A method of fabricating a thin film transistor substrate for a liquid crystal display device, comprising the steps of:
forming a thin film transistor array on a substrate of the liquid crystal display device including a plurality of signal lines;
forming an organic insulating film on the substrate on which the thin film transistor array has formed;
patterning the organic insulating film;
treating a surface of the organic insulating film using plasma consisting essentially of helium to roughen the entire surface of the organic insulating film; and
forming a transparent electrode layer on the organic insulating film,
wherein the roughened surface of the organic insulating film has a coarseness that is small and substantially evenly distributed over the entire surface for improving adhesion between the transparent electrode layer and the organic insulating film.

3. The method according to claim 2, wherein during the treating a surface, the helium plasma physically impacts onto the surface of the organic insulating film.

4. The method according to claim 2, wherein the step of forming an organic insulating film uses a material having a small dielectric constant.

5. The method according to claim 4, wherein the material includes at least one of an acrylic system, benzocyclobutene (BCB) and perfluorocyclobutane (PFCB).

6. A method of fabricating a thin film transistor substrate for a liquid crystal display device, comprising the steps of:
- forming a thin film transistor array and a plurality of signal lines on a substrate of the liquid crystal display device;
- forming an organic insulating film on the substrate material on which the thin film transistor array has formed;
- patterning the organic insulating film;
- treating a surface of the organic insulating film in an atmosphere consisting essentially of a chemically stable inert gas having a small atomic size to roughen the entire surface of the organic insulating film; and
- forming a transparent electrode layer on the organic insulating film,
  wherein the roughened surface of the organic insulating film has a coarseness that is small and substantially evenly distributed over the entire surface for improving adhesion between the transparent electrode layer and the organic insulating film.

7. A method of manufacturing a liquid crystal display device having a thin film transistor, comprising the steps of:
- providing an organic insulating film on a substrate of the liquid crystal display device;
- treating a surface of the organic insulating film using plasma consisting essentially of helium to roughen the entire surface of the organic insulating film;
- depositing a pixel electrode on the roughened surface of the organic insulating film,
  wherein the entire roughened surface of the organic insulating film has a coarseness that is small and substantially evenly distributed over the entire surface for improving adhesion between the pixel electrode and the organic insulating film.

* * * * *